United States Patent [19]

Ferber et al.

[11] Patent Number: 5,464,557
[45] Date of Patent: Nov. 7, 1995

[54] COMPOSITIONS FOR CLEANING ARTICLES WITH 2-ETHYLHEXANOL AND P-CYMENE

[75] Inventors: Gerald J. Ferber, Cuddington; Graham J. Smith, Chester, both of England

[73] Assignee: Bush Boake Allen Limited, United Kingdom

[21] Appl. No.: 185,584

[22] Filed: Jan. 21, 1994

Related U.S. Application Data

[60] Division of Ser. No. 872,210, Apr. 22, 1992, Pat. No. 5,300,154, which is a continuation-in-part of Ser. No. 567,206, Aug. 14, 1990, abandoned, and a continuation-in-part of Ser. No. 600,372, Oct. 17, 1990, abandoned.

[51] Int. Cl.⁶ .............................. C11D 3/44; C11D 3/18; C11D 7/24; C11D 7/26
[52] U.S. Cl. .......................... 252/170; 252/162; 252/153; 252/364; 252/DIG. 9
[58] Field of Search ....................... 252/162, 153, 252/170, 171, 544, 172, DIG. 8, DIG. 9, 364; 134/10, 11, 12, 26, 30, 31, 38, 40, 42

[56] References Cited

U.S. PATENT DOCUMENTS

| | | | |
|---|---|---|---|
| 3,312,635 | 4/1967 | Liquori | 502/315 |
| 4,640,719 | 2/1987 | Hayes et al. | 134/40 |
| 4,665,252 | 5/1987 | Hoelderich et al. | 585/431 |
| 4,666,626 | 5/1987 | Francisco | 252/170 |
| 4,775,489 | 10/1988 | Watkins et al. | 134/40 X |
| 4,788,043 | 11/1988 | Kagiyama et al. | 134/12 |
| 4,830,772 | 5/1989 | Van De Mark | 134/38 |
| 4,867,800 | 9/1989 | Dishart et al. | 134/40 |
| 4,925,497 | 5/1990 | Thierheimer, Jr. | 252/170 |
| 4,934,391 | 6/1990 | Futch et al. | 134/40 |
| 4,983,224 | 1/1991 | Mombrun et al. | 252/170 X |
| 4,992,108 | 2/1991 | Ward et al. | 134/38 |

FOREIGN PATENT DOCUMENTS 0354027  3/1989  European Pat. Off. .

OTHER PUBLICATIONS

Kirk–Othmer, Encyclopedia of Chemical Technology, 3rd ed., 1983, month not known, John Wiley & Sons, vol. 22, pp. 710 and 711.

*Primary Examiner*—Paul Lieberman
*Assistant Examiner*—Douglas J. McGinty
*Attorney, Agent, or Firm*—Woodcock Washburn Kurtz Mackiewicz & Norris

[57] ABSTRACT

The invention relates to compositions for cleaning a wide range of soil types from dirty articles, such as metal, ceramic or glass substrates. A first class of solvent compositions used for cleaning is an oxidative stable mixture of non-polar aromatic hydrocarbons (p-cymene) and an organic polar component (2-ethylhexanol) for cleaning of low and intermediate polar soils. Alternately, water and surfactant is added to the mixture to form a water-in-oil emulsion for cleaning high polarity soils. A second class of solvent compositions used for cleaning dirty articles is a hydrogenated or dehydrogenated analogue of a terpene compound. The solvent composition is used in a process wherein a dirty article is contacted with the solvent under conditions that result in cleaning the soil type from the article. Residual solvent contamination is removed from the article surface by contacting the contaminated article at an elevated temperature with an aqueous medium and/or a low-boiling solvent. The solvent residue is then removed by evaporation.

3 Claims, 5 Drawing Sheets

COMPOSITIONS FOR CLEANING ARTICLES WITH 2-ETHYLHEXANOL AND P-CYMENE

This application is a divisional of application Ser. No. 07/872,210 filed Apr. 22, 1992, now U.S. Pat. No. 5,300,154, which is a continuation-in-part of application Ser. No. 07/567,206 filed Aug. 14, 1990, now abandoned and Ser. No. 07/600,372 filed Oct. 17, 1990, now abandoned.

This invention relates to a method and composition for the cleaning of dirty articles. Such articles may be, for instance, relatively small metal, ceramic or glass articles, circuit boards or machined parts.

It is routine practice to clean dirty surfaces by contacting them with an aqueous or non-aqueous liquid, and to promote the cleaning by forcing the liquid against the surfaces. Surfaces can be cleaned by water, often brushed on or applied as a jet, and then left to dry. However, water is not very effective for removing organic residues, and steaming is sometimes used.

Aqueous detergent compositions will remove organic residues, but typically leave residues of detergents, necessitating thorough rinsing to remove these residues.

The most effective way of removing organic dirt from articles is generally recognized as involving contacting the articles with organic solvents that will dissolve the residues. This method typically requires large capital investment in equipment to clean the articles by contacting the articles with an organic solvent while the articles are held within a vessel. The contact can be by immersing the articles in a liquid phase solvent, or by exposing the articles to a vapor phase solvent, generally at a relatively cool temperature so that the solvent will condense on the articles.

The selected solvent must have adequate solvency power for the residues that are to be removed, it must have a flash point sufficiently above the temperature of use that it is safe to use, and preferably have a volatility such that it does not leave a residual film of solvent on the article. Preferably, therefore, the solvent evaporates relatively quickly when exposed to the ambient atmospheric temperature of, for instance, 30° C. or below.

Most low boiling hydrocarbons often have adequate solvency power and have adequate volatility, but they suffer from the disadvantage that they have low flash point. Higher boiling hydrocarbons may have adequate solvency power and a reasonably safe flash point, but their volatility is sufficiently low that residues remain on the articles unless the articles are deliberately heated, and this is undesirable because of the risk of the temperature approaching or exceeding the flash point.

Because of these difficulties, halogenated solvents were widely accepted as cleaners having suitable solvency power, adequately high flash point, and suitable volatility at safe temperatures. Examples are chlorocarbons, fluorocarbons and chlorofluorocarbons, the compounds generally containing below 4 carbon atoms, often 1 or 2 carbon atoms.

The industry has made vast investment in apparatus for cleaning hard surfaces such as circuit boards and soft surfaces such as fabrics with such solvents. Possible environmental disadvantages of the use of such solvents is widely recognized. A very large number of alternative solvents have, therefore, been investigated, especially in recent years, but none of them have yet proved to be commercially as convenient to use as the halogenated hydrocarbons which they are intended to replace.

There is, therefore, an acute need for achieving satisfactory cleaning of articles using a solvent having good solvency power which is preferably not a volatile halogenated hydrocarbon in such a way that there are substantially no solvent residues left on the article and workers are not exposed to a flash hazard. Preferably this objective would be achieved with a minimum of modification of the existing apparatus designed for use with, for instance, chlorofluorocarbons.

Among the solvents that have been investigated heretofore are terpene solvents. Such solvents have been known for a very long time. For instance, terpene-based solvents were commercially available in the early 1940's. However, they have never proved to be of widespread commercial value. Part of the problem was that they tended to contaminate the article with residues of the terpene solvent, and this contamination rendered the article unacceptable. Also, the terpenes tend to readily contaminate or to form resinous products which are difficult to remove.

Para-menthadienes and mixtures of para-menthadienes and terpene alcohols are known as solvents ("Monocylic Terpene Hydrocarbons" and "Blended Terpene Solvents," *Hercules Review*, 1942). However, para-menthadienes are susceptible to atmospheric oxidation (even in the presence of anti-oxidants), resulting in both formation of residue and conversion of para-menthadienes to other products (primarily para-cymene and epoxides). Oxidation and residue formation in an immersion cleaning tank will adversely affect the efficiency of the cleaning process, and cause the build-up of co-boiling impurities which reduce solvent recyclability. Hydrolytic instability resulting in residue formation in the water rinse tank also leads to contamination of the cleaned work piece.

If the hydrolytic instability is oxygen promoted, residue formation in both the rinse and immersion tanks can be significantly reduced by operating both process steps under inert gas blankets (e.g., nitrogen). However, provision of full blanketing and prevention of ingress of oxygen into the two tanks increases equipment cost and complicates the operation of the cleaning process. Furthermore, differences in boiling point of the components of the above solvent mixture leads to different distillation rates during solvent recycle.

The object of this invention is to meet the acute need to provide a method of cleaning dirty articles, which method is environmentally acceptable and that provides articles having a cleanliness that can meet the highest standards, for instance, the standard of the electronics industry.

Additionally, the invention is aimed at developing a solvent composition for use in the immersion-clean/steam-rinse process, as described hereunder, which does not suffer from the previously described problems.

SUMMARY OF THE INVENTION

In accordance with the present invention, dirty articles are cleaned by contact with a first class of solvent compositions comprising a portion of a $C_9$–$C_{12}$ aromatic hydrocarbon of from about 99 to about 1 weight percent, a portion of a $C_7$–$C_{10}$ organic polar component of from about 1 to about 99 weight percent, and alternately, a portion of water sufficient to form a water-in-oil emulsion. The solvent composition may further contain a surfactant for the purpose of assisting in forming the water-in-oil emulsion.

The aromatic hydrocarbons can be made synthetically starting from, for instance, petrochemicals, or they can also be made by dehydrogenation of certain terpenes. The polar component may be either an alcohol, an amine, a ketone, or an ester which is selected such that it will either form an azeotrope with the aromatic hydrocarbon or has a boiling point sufficiently similar to the boiling point of the aromatic hydrocarbon such that a distillate of the solvent composition is substantially uniform in constituency throughout distillation.

The solvent composition is capable of cleaning a wide range of soil types from articles and exhibits improved solvent life and cleaning performance, quantitatively expressed as the soil loading capacity of the solvent, which allows the solvent to be used in cleaning a large quantity of soil.

In another aspect of the invention, a dirty article is cleaned by contact with a second class of solvents that comprises a hydrogenated or dehydrogenated analogue of a terpene compound. Although such compounds can be made synthetically starting from, for instance, petrochemicals, the preferred solvents are made by hydrogenation or dehydrogenation of components of terpenes derived from, for instance, wood and other vegetable products such as turpentine. For convenience, these analogues and derivatives are referred to below as "terpene-analogue solvents".

The solvent composition is used in a cleaning process wherein a dirty article is contacted with the solvent under conditions that result in cleaning of dirt from the articles. Any residue deposited on the surface of the article is removed by contacting the contaminated article at an elevated temperature with an aqueous medium which removes the residual solvent from the article surface. The solvent contamination, or residual solvent, is evaporated from the surface. Preferably, the residual solvent will form an azeotrope with condensed steam in the rinse stage of the cleaning process, which azeotrope can then be removed from the article surface by evaporation.

DESCRIPTION OF THE PREFERRED EMBODIMENTS

Figure 1:
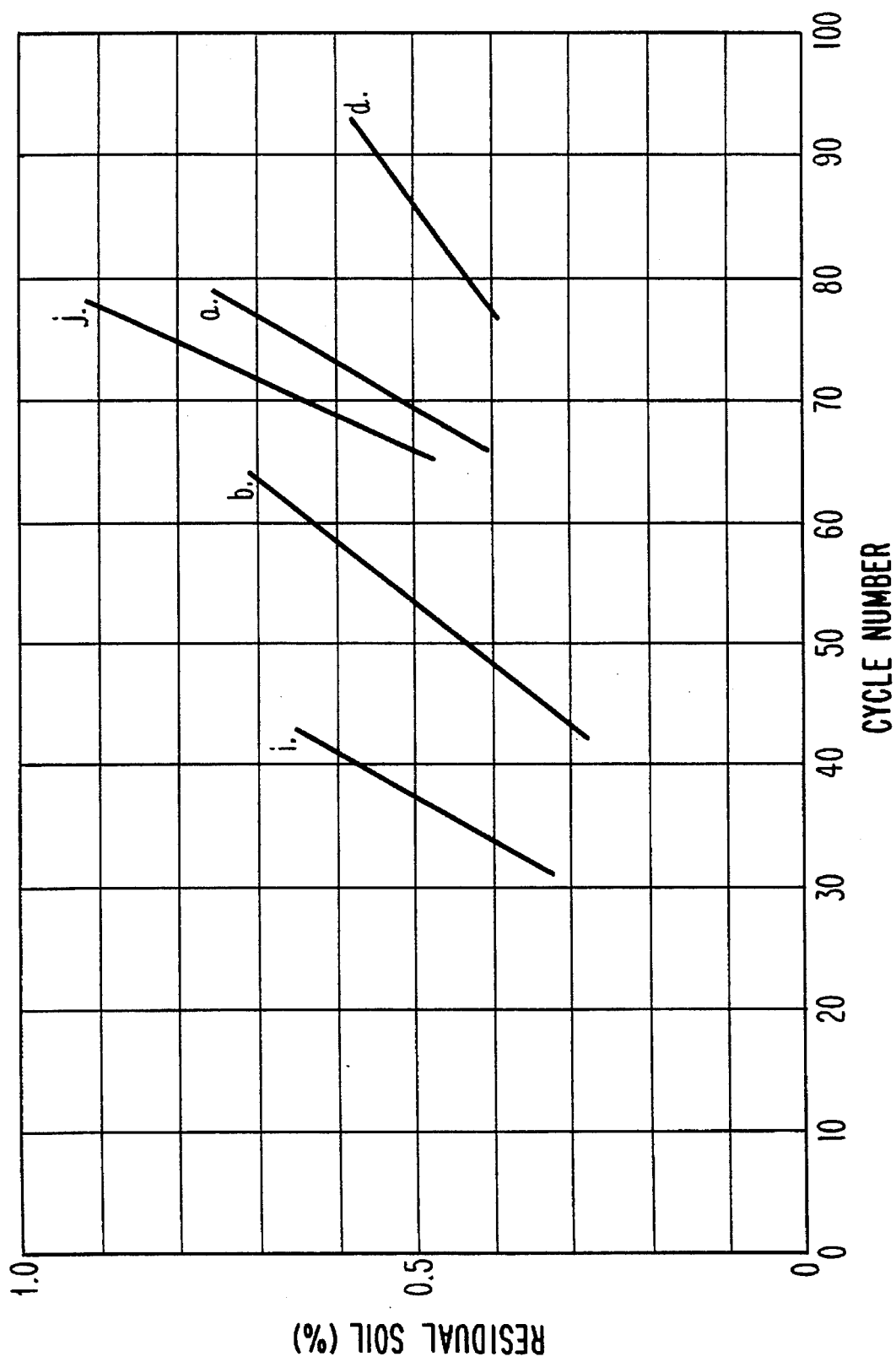
FIG. 1 is a graphic representation of cleaning performance comparisons in the removal of a low polarity soil, such as a light oil.

In accordance with the present invention, it is possible to obtain articles having exceptional cleanliness, in a manner that is highly desirable from the environmental point of view. Both solvent and water used in the cleaning process can be recycled, and vapor emissions can be reduced to satisfactorily low values.

The use of solvents for cleaning articles, particularly for the removal of organic soils, is of major importance to industry. In many cleaning applications, a solvent is required to remove more than one type of soil contaminant from individual articles. Different types of soil contaminants which must be removed include low polarity soils, such as oils and grease; intermediate polarity soils, such as rosin acid flux used in printed circuit board manufacture; and high polarity soils, such as inorganic ionic residues.

For a solvent to be effective in removing a wide range of soils of different polarity, it should preferably contain a mixture of non-polar and polar components. The advantage of the solvent composition of this invention is that such a wide range of soil types can be cleaned from articles. Most important is the removal of oils and grease from metal parts, and the removal of rosin fluxes and residual grease, for example, finger prints, from printed circuit boards. Accordingly, the invention provides for methods and solvent compositions for cleaning of a wide range of soils from individual articles.

A first class of solvent compositions of the present invention includes a constant boiling, high soil loading capacity, oxidative stable, and environmentally safe solvent composition comprising a portion of a $C_9$–$C_{12}$ aromatic hydrocarbon selected from the group consisting of

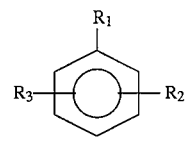

or the mixtures thereof, wherein $R_1$ is $CH_3$, $R_2$ is a straight-chained or branched lower alkyl, and $R_3$ is selected from the group consisting of hydrogen and a low straight-chained alkyl having from 1 to 5 carbon atoms; and a portion of a $C_7$–$C_{10}$ organic polar component, wherein the solvent composition comprises from about 99 to about 1 weight percent of the aromatic hydrocarbon, and from about 1 to about 99 weight percent of the organic polar component. Alternately, the solvent composition may contain a portion of water sufficient to form a water-in-oil emulsion, which emulsion is capable of removing high polarity soils. Where water is present in the solvent composition, a cationic, anionic, or nonionic surfactant may be used to facilitate the formation of the emulsion. The water/surfactant portion of the solvent composition, when utilized, is present at levels up to about 40 weight percent. Preferably, the solvent composition comprises from about 5 to about 95 weight percent of the aromatic hydrocarbon, and from about 5 to about 95 weight percent of the organic polar component. More preferably, the solvent composition comprises from about 75 to about 25 weight percent of the aromatic hydrocarbon, and from about 25 to about 75 weight percent of the polar organic component. Most preferably, the solvent composition comprises about 75 weight percent of the aromatic hydrocarbon, and about 25 weight percent of the organic polar component.

This first class of solvent compositions is superior to solvents previously used for cleaning articles in that it exhibits superior cleaning performance, is oxidative and hydrolytic stable under conditions of use, and during distillation, a distillate of the solvent composition which is substantially uniform in constituency throughout distillation, is recovered. The distillation procedure employed for solvent recycle can be either atmospheric or sub-atmospheric pressure distillation, or preferably steam distillation.

An important factor for commercial cleaning operations is solvent life (before recovery or disposal, as required), which is the ability of the same solvent to be reused for cleaning a large number of dirty articles. The operational performance of the solvent will depend in part upon the number of cleaning operations which can be completed with a given solvent before fresh solvent is required. This property can be expressed quantitatively as the solvent soil loading capacity, which is expressed by the formula:

$$S = \frac{W \times C}{V \times P} \times 100$$

where W equals the average weight of soil removed from the article per cleaning cycle; C equals the last successful cleaning cycle; V equals the solvent volume; and P equals the solvent density.

Laboratory trials simulating cleaning processes have demonstrated a surprising benefit for the solvent composition disclosed, which is not predictable from a knowledge of the cleaning performance of the individual aromatic hydrocarbon and polar organic components. In combining the aromatic hydrocarbon and polar organic component, a synergistic effect has been noted whereby the solvent mixture has an actual soil loading capacity which is higher than the weighted average of the soil loading capacity for the individual aromatic hydrocarbon and polar organic components. This synergistic effect provides for improved solvent life, which makes the inventive solvent composition desirable from both an economic and environmental aspect, in that less solvent will be required over a longer period of time in the cleaning process.

Another important characteristic which the solvent composition must exhibit is similar steam distillability of both components for more effective solvent removal in the steam rinse step of the disclosed process. The solvent must also possess the desired atmospheric pressure boiling points and vapor pressures for cleaning applications.

Solvents with low vapor pressures do not significantly contribute to volatile organic chemical emissions, and are easily contained within cleaning equipment without the need for specialized vapor collection or scrubbing devices. Therefore, the lower molecular weight limit for the solvent components is $C_9$ for the aromatic hydrocarbons and $C_7$ for the organic polar components. On the other hand, solvents with too high a boiling point are difficult to distill with simple equipment during solvent recovery and recycle processes. Therefore, the upper molecular weight limit for the aromatic hydrocarbon is $C_{12}$, while the upper limit for the polar organic component is $C_{10}$. Preferably, boiling points should not exceed 220° C., and ambient temperature vapor pressure should not exceed 2 millimeters mercury per 20° C.

To be used economically in a cleaning process, the solvent must be easily recycled. It is therefore essential that the solvent composition distill over a very narrow range, or form an azeotrope boiling at a single temperature. The preferred technique for solvent recycle is steam distillation in the immersion-clean/steam-rinse process. For these reasons, the aromatic hydrocarbon and polar organic component must either be capable of forming an azeotrope, or have boiling points sufficiently similar such that a distillate of the solvent composition is substantially uniform in constituency throughout recovery.

In a preferred embodiment wherein the solvent composition comprises a portion of an aromatic hydrocarbon and a portion of a polar organic component, it is demonstrated that the solvent composition efficiently cleans intermediate and low polarity soils from the articles. While the solvent composition will clean intermediate and low polarity soils, certain high polarity soils will require the concurrent use of water. Preferably, a water-in-oil emulsion would be employed through the use of a suitable surfactant. The portion of water employed will be sufficient to form a water-in-oil emulsion, which emulsion will be capable of removing the high polarity soils. The surfactant is anionic, cationic, or nonionic, and is either azeotropically volatile, or sufficiently volatile to ensure that the surfactant is removed from the article's surface along with the water-in-oil emulsion.

The solvent composition must also be stable to oxidation under the hydrolysis conditions encountered in the hot water/steam distillation during the immersion-clean/steam-rinse process. If the solvent composition does not exhibit the required stability, polymerization or degradation reactions take place, thereby forming undesired resinous or residual impurities.

The aromatic hydrocarbons utilized in the solvent composition contain from 9 to 12 carbon atoms, and are selected from the group consisting of

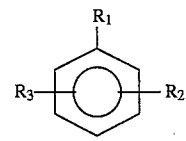

or mixtures thereof, wherein $R_1$ is $CH_3$, $R_2$ is a straight-chained or branched lower alkyl, and $R_3$ is selected from the group consisting of hydrogen and a lower straight-chained alkyl having 1 to 5 carbon atoms. The hydrocarbons can be made synthetically starting from petrochemicals, or can be derived by dehydrogenating certain terpene compounds found in, for instance, wood and other vegetable products. More preferably, the aromatic hydrocarbon is selected from the group consisting of para-cymene, meta-cymene, trimethylbenzene, and ethyltoluene. Most preferably, the aromatic hydrocarbon is para-cymene.

The $C_7$–$C_{10}$ organic polar component may be an amine, alcohol, ester, or a ketone. It is selected such that it is capable of forming an azeotrope with the aromatic hydrocarbon, or has a boiling point sufficiently similar to the boiling point of the aromatic hydrocarbon such that a distillate of the solvent composition is substantially uniform in constituency throughout distillation. The organic polar component is preferably a $C_7$–$C_{10}$ alcohol; more preferably a $C_8$ saturated alcohol, such as 1-octanol, 2-octanol, or 2-ethylhexanol; and most preferably the organic polar component is 2-ethylhexanol.

In a most preferred embodiment, the solvent composition comprises about 75 weight percent para-cymene and about 25 weight percent 2-ethylhexanol. The para-cymene can be manufactured from a number of turpentine-derived feedstocks, as well as from petrochemical sources. Atmospheric oxidation studies have shown that para-cymene stabilized with an anti-oxidant does not oxidize under normal conditions (immersion tank temperature 35° C.), and even unstabilized para-cymene shows a very low susceptibility to oxidative attack. Table 1 compares the oxidative stability of para-cymene versus para-menthadienes in terms of peroxide and residue formation. The higher the peroxide and residue values are, the more susceptible to oxidative attack is the solvent. These tests were conducted under conditions of limited exchange of oxygen into the head space.

In the immersion-clean/steam-rinse process described hereunder, it is important that the solvent exhibits a high degree of stability in hot water, i.e., hydrolytic stability. Our studies have confirmed that, unlike para-menthadienes, para-cymene is stable on prolonged exposure to boiling water (Table 2). These tests similarly were conducted under conditions of limited exchange of oxygen into the head space.

Steam distillation studies have shown that while 2-ethylhexanol does not appear to form an azeotrope with para-cymene, its boiling point is sufficiently similar to that of the para-cymene such that the distillate of the mixture is substantially uniform in constituency throughout the steam distillation recycle process (Table 4). In addition, solvent recovery was 99% for the para-cymene based solvent, and again reflects the greater stability of the para-cymene/2-ethylhexanol to hot water/steam distillation conditions. The weight ratio of solvent to water in steam distillation of the 2-ethylhexanol/para-cymene mixture is 40% solvent and 60% water. This high ratio of solvent will provide an efficient solvent recovery process by steam distillation.

Figure 2:
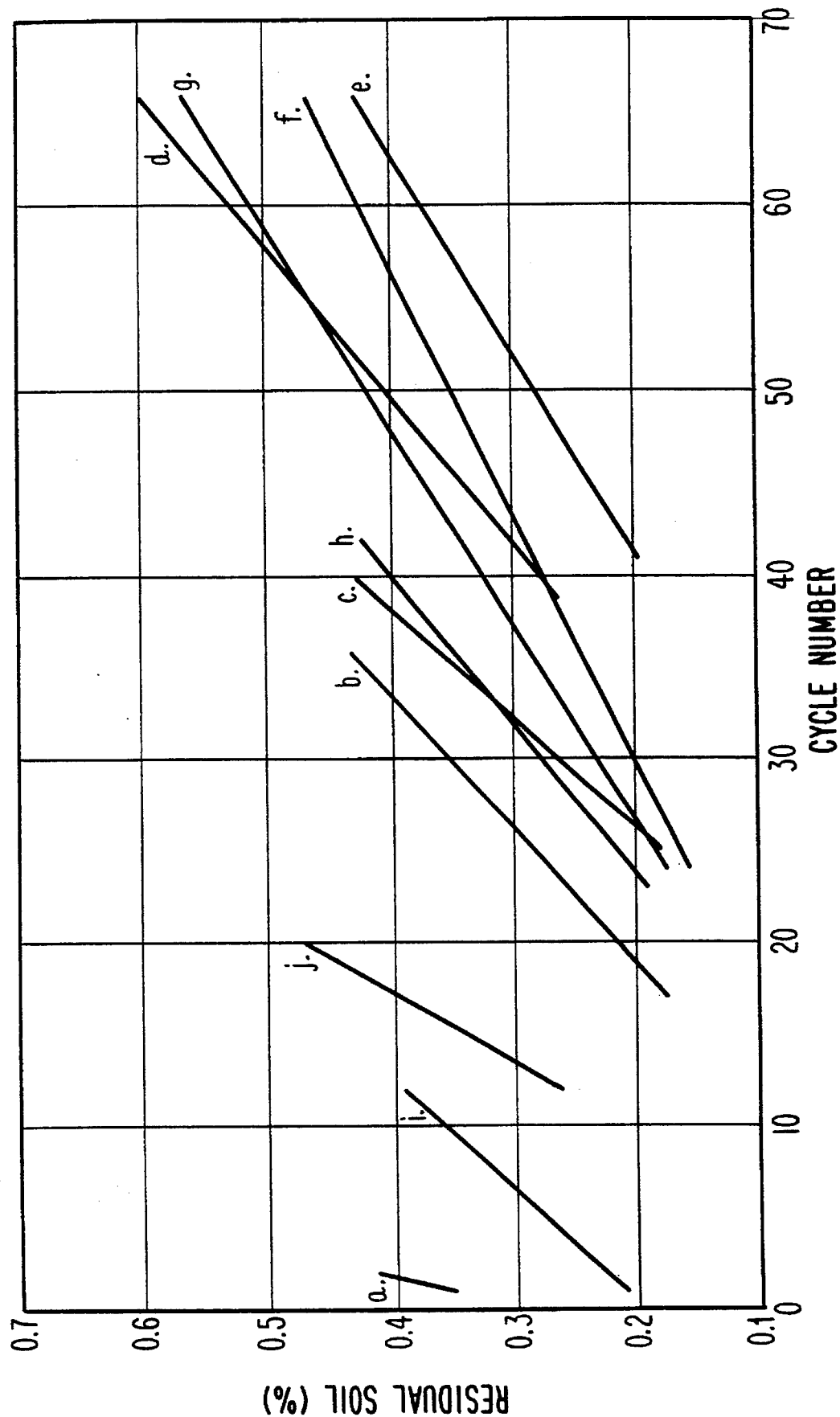
FIG. 2 is a graphic representation of cleaning performance comparisons in the removal of an intermediate polarity soil, such as abietic acid.
Figure 3:
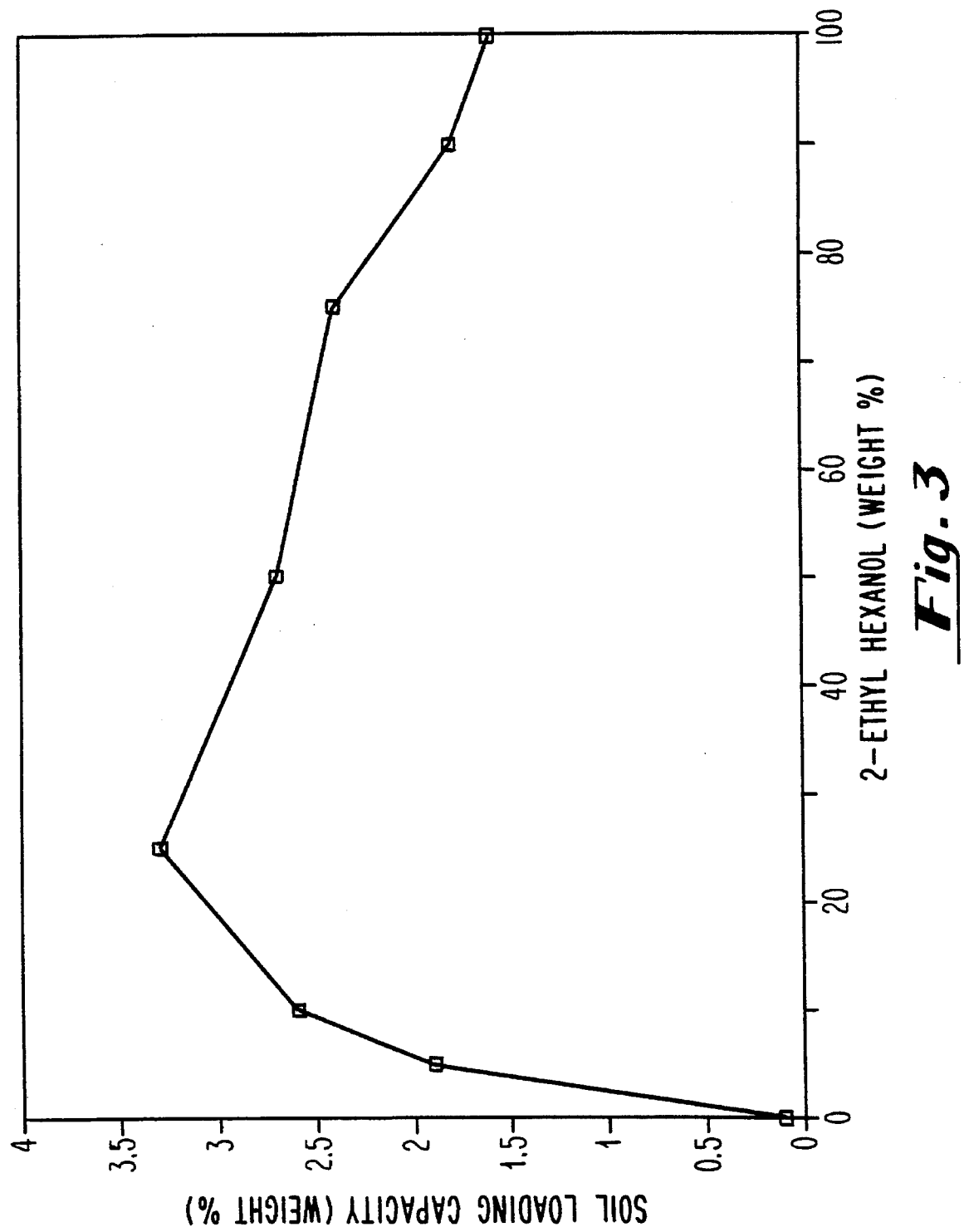
FIG. 3 is a graphic representation of soil loading capacity with respect to an intermediate soil, such as abietic acid, as a function of weight percent of a preferred polar organic component (2-ethylhexanol).

Cleaning performance studies comparing para-cymene/2-ethylhexanol mixtures of varying concentrations, neat para-cymene, neat 2-ethylhexanol, para-menthadiene/terpene alcohol mixtures, and para-menthadienes, were conducted to determine the soil loading capacity of the relative solvents. Soils employed in the tests were a low-polarity light oil and an intermediate polarity abietic acid (component of rosin flux). The soils were selected to demonstrate broad cleaning performance over a range of low polarity and intermediate polarity soils. FIGS. 1 and 2 show how cleaning performance is affected by soil buildup in the solvent when removing abietic acid and light oil. It can be seen that in successive cleaning cycles, soil deposition is linear on reuse of the solvent.

The results surprisingly show that para-cymene/2-ethylhexanol mixtures give superior performance to both the para-menthadiene/terpene alcohol solvent mixture and para-menthadiene alone (Table 3). More surprising is that the performance of the mixture is significantly greater than would be predicted from the weighted average of the individual components. For example, a solvent composition having 90% para-cymene and 10% 2-ethylhexanol has relative soil loading capacities of 2.6 for abietic acid and 3.3 for light oil, compared to weighted average soil loading capacities of 0.17% for abietic acid and 2.6% for light oils.

A second class of solvents can be used to clean dirty articles, the solvent composition of this class having a hydrogenated or dehydrogenated analogue of a terpene compound. For convenience, these analogues and derivatives are referred to as "terpene-analogue solvents".

The flash point (closed cup) of the terpene-analogue solvent is usually below 150° C. and often below 125° C. The solvent can be a mixture, and generally most or all of the solvent in the mixture has a flash point below 100° C.

The boiling point of the terpene-analogue solvent (which may be a mixture) is generally about 70° C., most usually above 100° C., and generally above 130° C. Since the solvent is often a mixture, it will often boil over a range of temperatures, and the boiling point quoted above is the bottom of this range. Generally, the boiling point is below 250° C. (i.e., the top of the boiling range should be below 250° C.). Solvents that boil at temperatures somewhere within the range of 150°–200° C. are often preferred.

The invention can also be applied with other methods of removing the residual solvent contamination. For instance, the article after cleaning with the defined terpene-analogue solvent can be immersed in or sprayed with a medium consisting of the low boiling solvent at low or high temperatures, or may be washed with an aqueous solution of a surfactant, preferably a volatile surfactant. Alternatively, washing in cold or warm water can be useful.

The terpene analogues to which the second class of solvents relate include cymenes, menthenes and menthanes, often as the para isomer. A preferred solvent comprises para cymene.

The advantage of using the terpene-analogue class of solvents is that they provide the benefit of cleansing power and environmental factors similar to terpene solvents while avoiding any risk of the formation of polymerization products during use.

The analogues can be blended with other materials, provided such other materials do not destroy the advantages that are gained by use of the analogues. Generally, at least 50% of the solvent is selected from cymene, menthene and/or menthane. Particularly preferred are novel compositions comprising 50–90% para or other menthenes, 2–20% para or other cymene, 0–40% para or other menthadianes and 0–20% para or other menthanes. The combination of at least 50% para menthane with a lesser amount para cymene is particularly valuable, as are blends of such analogue solvents with terpene alcohols. The meta-isomer can be used in place of the para-isomer.

In one aspect of the invention, the analogue solvent contamination that remains after the terpene-analogue cleaning stage is removed azeotropically by forming an azeotrope with an aqueous medium. The azeotrope-forming capabilities of terpene-analogue solvents are particularly advantageous, and this constitutes another reason why the terpene-analogue solvents are particularly preferred in the invention.

Although adequate results are often achieved as a result of the formation of an azeotrope between the analogue solvent and the water, azeotroping can be promoted, and in particular the azeotroping temperature can be reduced, by including a suitable tertiary solvent. Additionally, the removal of the analogue solvent contamination is promoted if the contamination is spread as a thin film over the article, rather than being concentrated in droplets, and so the presence of a depressant for surface tension is beneficial. Many tertiary solvents that promote the formation of an azeotrope will also help film formation.

These additional solvents should be low boiling solvents so that they are more volatile than the terpene-analogue or other main solvent. In general, they should boil at a temperature below the azeotroping temperature, so as to ensure that none of the tertiary solvent remains as a residual contamination. Generally they boil at below 100° C. Various aliphatic compounds such as ketones or, preferably, amines, ethers or alcohols may be used. The total number of carbon atoms in such materials is generally below 8 and preferably each aliphatic group in such compounds contains less than 8, usually 2 to 4, carbon atoms. Particularly preferred materials are propanols and butanols such as isobutanol or, preferably, isopropanol.

Instead of, or in addition to, including such low boiling solvents with the use of the terpene-analogue solvent to promote film formation, it is also possible to include a surfactant. This should preferably be a volatile surfactant and in particular it should be azeotropically volatile.

These additives may be included in the terpene-analogue solvent with which the dirty article is initially contacted, and may thus promote the cleaning of the article, typically in an amount of below 10% by weight of the total terpene solvent composition. In other methods, however, the aqueous medium contains the low boiling solvent or other additive. Thus the aqueous medium can consist of water or a mixture of water and the low boiling solvent. The ratio low boiling solvent:water can be from 1:50 to 10:1, generally 1:20 to 1:1.

Although some low boiling, and usually water miscible, organic solvent can be included in the terpene-analogue or other cleaning solvent, generally substantially all of this cleaning solvent is immiscible with water. From the environmental and economic point of view, an important feature of the invention is that the azeotrope that is formed between the terpene-analogue or other cleaning solvent and the water is condensed and is allowed to phase separate, and the terpene-analogue solvent phase is separated and is recycled for subsequent use in cleaning of dirty articles.

The azeotrope is therefore preferably formed by evaporation of the azeotropic mixture (generally at a temperature below 100° C.) in a vessel that contains the aqueous medium in its base and that has an outlet for evaporated azeotrope and a condenser across the outlet on which the azeotrope is condensed.

The process of cleaning the dirty articles with both classes of solvent compositions of this invention is preferably conducted in a multi-stage apparatus comprising one or more solvent-cleaning tanks and one or more rinsing tanks, including at least one azeotroping tank that has an outlet for volatile gases across which there is a condenser, including means for recovering condensate from the surfaces of the condenser. A solvent cleaning tank is, preferably, an immersion tank, i.e., it is designed for immersion of the dirty article into liquid solvent in the tank. If there is more than one solvent cleaning tank, the second tank can be another immersion tank, or it can be designed for vapor contact and for recovery of condensed solvent off the article.

The azeotroping tank preferably has a reservoir at its base for containing aqueous medium and a heater for heating the aqueous medium. The condenser across the outlet (often an open top) of the steaming, or azeotroping, tank may be a cool heat exchanger, for instance cooled by cold water, equipped with means for collecting condensate that condenses onto its outer surfaces. The condenser should be constructed so as to essentially prevent the escape of any solvent from the tank. The condensate, comprising the solvent and water, preferably is subjected to phase separation, with the solvent being recycled to one of the solvent cleaning tanks, and the water either being run to waste or recycled to the azeotroping tank.

Although it is adequate for the apparatus to consist solely of a liquid solvent cleaning tank and a steaming, or an azeotroping, rinse tank, particularly good results can be achieved when the apparatus consists of a liquid solvent cleaning tank, a second solvent cleaning tank wherein the articles are contacted with vaporized solvent in the presence of steam, and the steaming, or azeotroping, tank. The inclusion of water or steam with the solvent vapor reduces flammability, making the vapor cleaning of the articles safer. The mixed condensate of solvent and water can be recycled to the reservoir of this intermediate solvent cleaning tank without phase separation, or phase separation can be performed to facilitate control of the proportions of solvent and water in the reservoir.

A particularly valuable feature of the invention is that the apparatus in which it is performed can be substantially identical to existing ultrasonic cleaning apparatus for use with fluorocarbons and other halogenated, highly volatile, solvents, The only modification that has to be made is that aqueous medium is fed to the final tank in place of the fluorocarbon that previously was fed to that tank for evaporation, the heater in that tank has to have the required heat output, and the temperature in the condenser has to be adjusted to condense the solvent and water. When the conventional tank has two vapor phase stages after a liquid immersion tank, it will be necessary to provide means for supplying water also to the reservoir in the second stage.

Contact of the articles with the terpene-analogue or other solvent can be vapor contact provided the vessel contains sufficient amounts of an inert gas (for instance, carbon dioxide, nitrogen, steam or other oxygen-free gas) to raise the flash point adequately, or the solvent itself has a sufficiently high flash point to cause no flash danger.

Generally, contact of the articles with the solvent composition is by immersion in liquid solvent at a temperature that preferably is well below the flash point, for instance at least 10° C. and often at least 20° C. below the flash point of the solvent. The cleaning effectiveness of contact can be promoted by mechanical or, preferably, ultrasonic agitation of the solvent.

Contact of the article with the solvent composition generally results in a solvent residue being deposited on the surface of the article. Upon contact of the article with the aqueous medium, the solvent residue forms an azeotrope with the medium.

Azeotroping is generally conducted at a temperature of below 100° C. The surface from which azeotropic evaporation is to occur should preferably have an elevated temperature. The article may be pre-heated (either in the solvent treatment stages or previously), but often the article is heated to the desired azeotroping temperature by contact with the aqueous medium at an elevated temperature. Preferably the temperature of the surface is at least 60° C., usually at least 80° C., and preferably at least 95° C. Best results are achieved if the temperature is 98° C. or, preferably, 100° C. The use of such temperatures facilitates removal of residue from the article surface. Indeed, it can be desirable to continue contact with hot aqueous medium after substantially all the azeotroping has been completed, primarily to raise the surface to a sufficiently high temperature as to promote final evaporation of the solvent residue.

A preferred method of performing the contact with the aqueous medium is to contact the contaminated surface with the aqueous medium at a temperature of at least about 98° C. Preferably, therefore, the aqueous medium is applied as steam, and this steam can either consist substantially only of water vapor or it can comprise water vapor and a spray of water very near to its boiling point. Thus, a boiling water spray (i.e., wet steam) is particularly preferred. The steam that condenses onto the article will remove from the article water-soluble residues that may not have been removed by the contact with solvent, examples being inorganic salts.

Best results are generally obtained when the azeotropic evaporation of the solvent residue is conducted while the article is exposed to a gaseous atmosphere. Often, therefore, the article is held in a stream of steam, and in particular by holding the article above a reservoir containing boiling water or other aqueous medium.

However, another method that can be conducted is to immerse the article in hot aqueous medium, and then lift the article out of the medium and allow azeotropic evaporation to occur off the surface of the article, due to the elevated temperature of the surface. For instance, the aqueous medium can have a temperature of from 60° to 99° C. and the temperature must be such, having regard to the components in the aqueous medium and the solvent, that evaporation will occur off the surface when the article is lifted out of the aqueous medium.

In another method, the solvent-cleaned article (preferably pre-heated) is immersed in liquid aqueous medium and azeotropic evaporation of the solvent and water is conducted while the article remains immersed in the liquid.

An advantage of the presence of the aqueous medium, and in particular of processes in which the atmosphere above the aqueous medium is saturated by steam, is that this raises the flash point of the solvent in the ambient atmosphere. In the absence of the steam the solvent would frequently be above its flash point and so simple heating at the temperature of the steaming would be dangerous.

The safety of the process, and the performance, can be improved further by including additional materials in the steam atmosphere either to promote volatilization of the solvent or to raise the flash point of the combined vapors, or both. For instance, the flash point of the vapors will be raised if the steaming is conducted in the presence of an inert gas, such as nitrogen.

The process of the present invention can be applied to the treatment of soft surfaces such as fabrics and other fibrous materials, but preferably is applied to the treatment of hard surfaces such as glass, ceramics, and metal. The articles having these surfaces can be, for instance, machined metal parts or, preferably, printed circuit boards. The articles are held in the solvent cleaning tank and the subsequent tank in or on suitable containers, for instance, by being suspended from a holder or by being supported in or on a holder, for instance a tray.

Apparatus suitable for use in the process of cleaning and rinsing articles as described above are illustrated in FIGS. 4–6. The apparatus of FIG. 4 includes a solvent cleaning tank 2 filled with solvent 4 to the level shown, and provided with ultrasonic generators 12, an open top 6 for the introduction of articles 8 to be cleaned, and a heater 10.

A second tank 14 equipped with a heater 16 is filled with an aqueous medium 24 to the level shown, and is connected by a weir 18 to a third tank 20 having a heater 22. The third tank 20 is filled to the level shown with aqueous medium 24 that is boiled by a heater 22 to generate steam. The combined tanks 14, 20 are open to permit articles 8 to be immersed in the aqueous medium in the second tank 14, and then exposed to the steam in the third tank 20.

A condenser 26 extends around the open tanks 14, 20 to collect azeotrope condensate in the collection trough 28. The condensate is carried to a vessel 32 in which the condensate separates into an aqueous phase 34 that is recycled by a line 36 to the second tank 14, and a solvent phase 38 that is recycled to the solvent cleaning tank 2 by a line 40.

Means (not shown) are provided for moving the articles 8 in sequence through the tanks.

Figure 5:
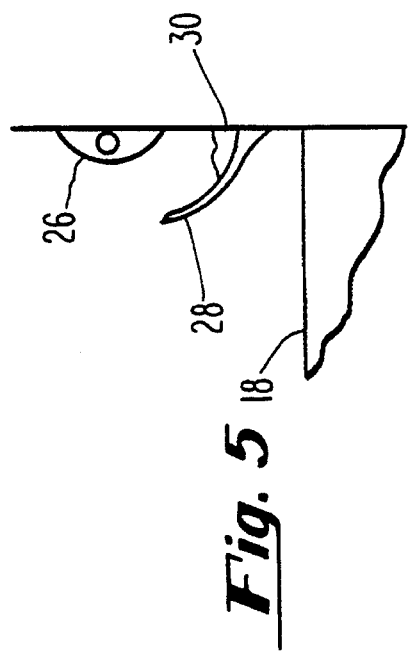
FIG. 5 is a cross-sectional view of the condenser and azeotrope collection trough taken along the line 5—5 in FIG. 4.

FIG. 5 is a cross-sectional view of the condenser 26 and collection trough 28, which extend around the open tanks 14, 20 to collect the azeotrope condensate 30 as it is evaporated from the article surface.

Figure 4:
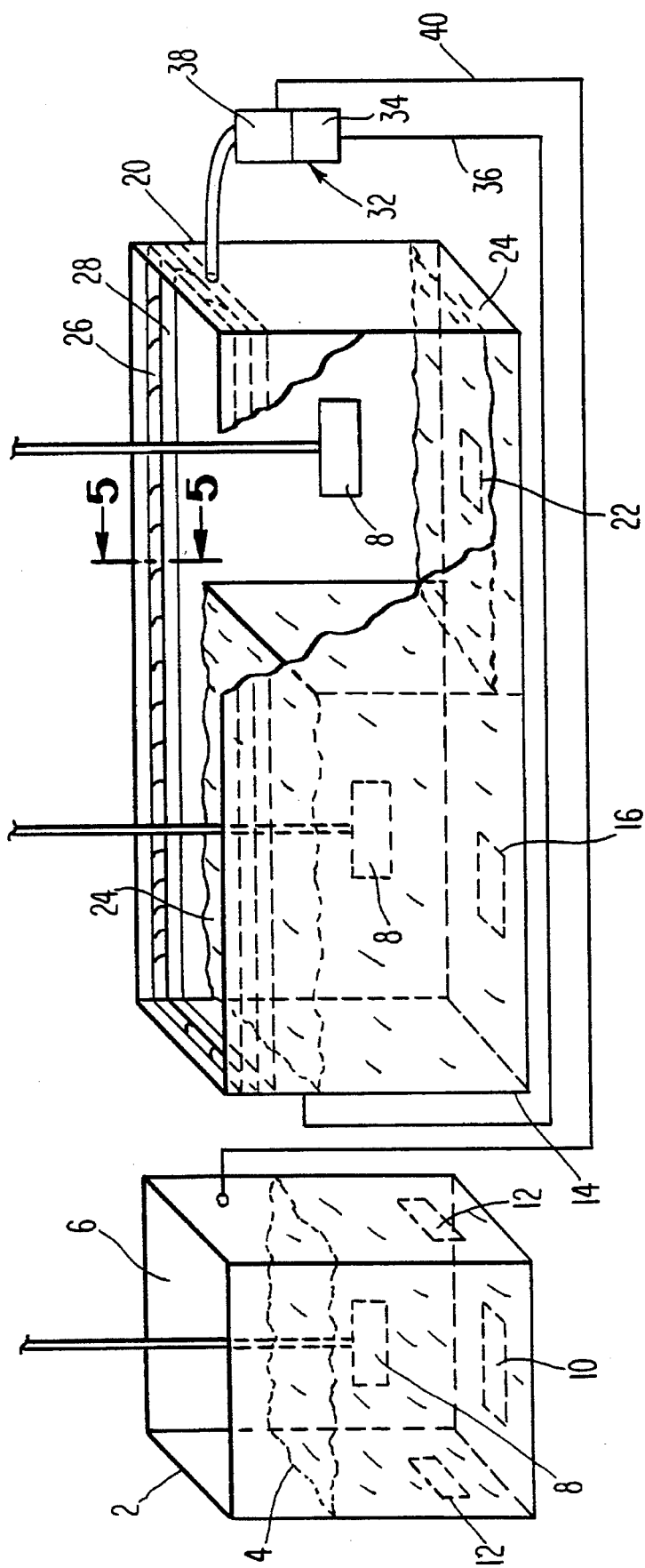
FIG. 4 is a partially cut away 3-dimensional side view of an apparatus for performing cleaning and rinsing of dirty articles.

Other embodiments utilizing the basic concept of FIG. 4 are possible, wherein the solvent cleaning tank 2 is used in conjunction with only the aqueous medium immersion tank 14 being used for removal of the solvent residue from the surface of the article. Likewise, the solvent cleaning tank 2 could be used in conjunction with only the steaming tank 20 for removal of the solvent residue from the article surface.

Figure 6:
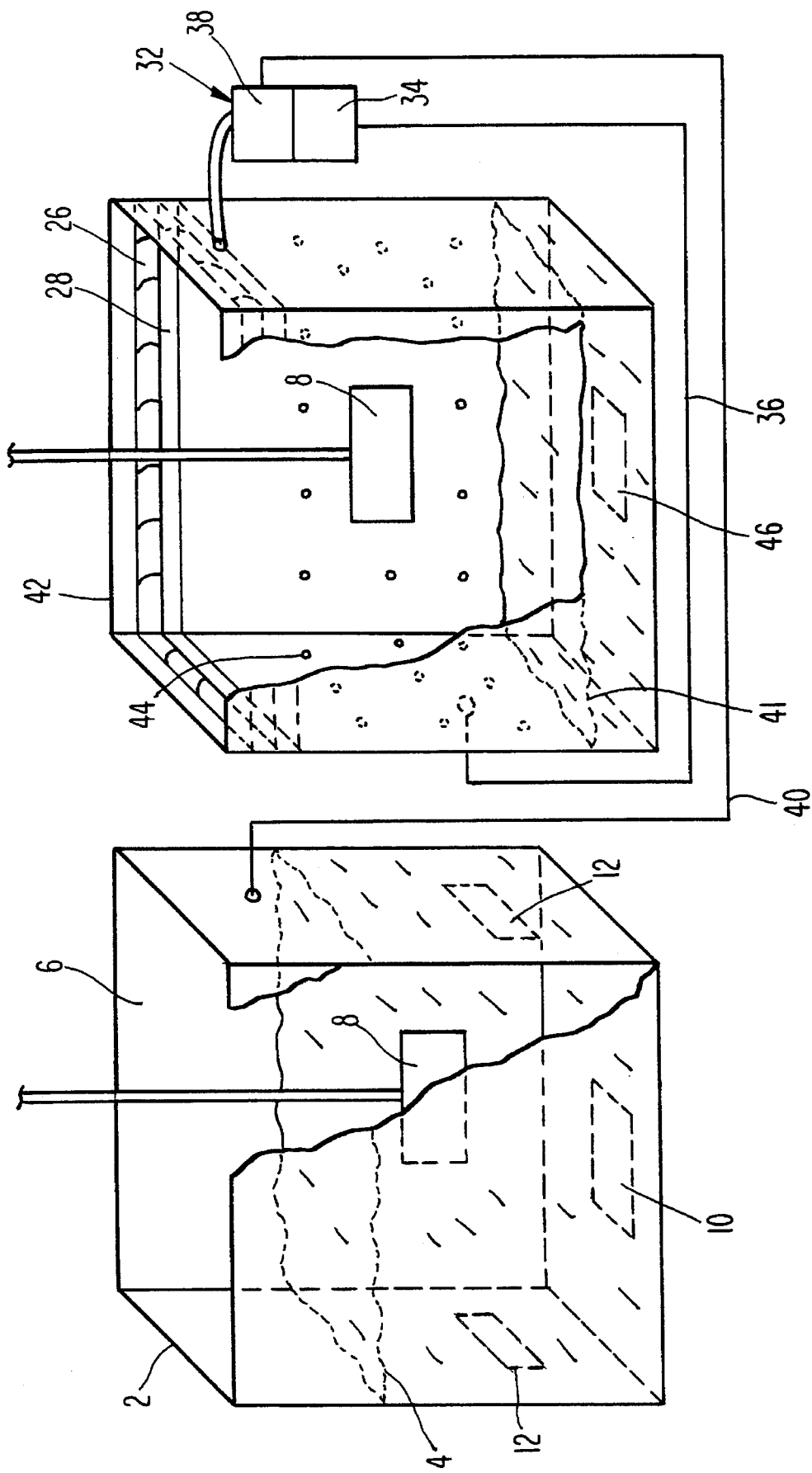
FIG. 6 is a partially cut away 3-dimensional side view of a preferred apparatus for cleaning and rinsing dirty articles.

In FIG. 6 is shown a preferred embodiment of the solvent-cleaning/steam-rinse process wherein the liquid solvent cleaning tank 2 is used in conjunction with a steam/hot water spray tank 42. The article 8 is removed from the solvent tank 2 and suspended in the steam/spray tank 42 which is filled with water 41 to the level shown, which water is heated to boiling by a heater 46. The article 8 is then subjected to steam, which is generated from the heated water 41, and a spray of near-boiling water which is sprayed from nozzles 44 located along the side and perimeter of the tank 42. The tank is equipped with a condenser 26 and collection trough 28 for collecting the azeotrope condensate and transferring the condensate to a vessel 32, wherein the condensate separates into an aqueous phase 34 that is recycled by a line 36 to the spray tank 42, and a solvent phase 38 that is recycled to the solvent cleaning tank 2 by a line 40.

Example 1

Oxidation Tests

The solvent to be tested (200 ml) was charged to a 500 ml single neck (B19) flask fitted with a single surface condenser and placed in a water bath maintained at 35° C. A sample (40 ml) of the solvent was withdrawn from the flask on day one, then subsequently every 5 days over the 21-day period. Samples were analyzed for peroxide content (iodometric titration) and residue (Kugelrohr distillation).

TABLE 1

Comparison of Oxidative Stability of Para-cymene and Para-menthadienes

|  | Peroxide Value (uM/L) | Residue (wt %) |
|---|---|---|
| para-cymene (stabilized) | 2 | 0 |
| para-cymene (unstabilized) | 8 | 0.1 |
| para-menthadienes (stabilized) | >20 | 13 |

Example 2

Hydrolytic Stability Tests

The solvent to be tested (200 g) was charged with distilled water (300 g) to a 1 L flask fitted with a mechanical stirrer, thermocouple and soxhlet/condenser. The stirred mixture was heated to reflux with return of the condensate via the soxhlet. Gentle reflux was maintained over a 70-hour test period.

At the end of the test period, the oil was analyzed for residue (Kugelrohr distillation) and peroxide formation (iodometric titration), and also analyzed by gas/liquid chromatography.

TABLE 2

Comparison of Hydrolytic Stability of Para-cymene and Para-menthadienes

|  | Residue (wt %) |
|---|---|
| para-cymene | 0.1 |
| para-menthadiene | 2.0 |

Example 3

High Soil Loading Capacity

Laboratory testing of overall cleaning performance was completed in the following manner:

A. A weighed, flat 60×55 mm stainless steel test piece was coated with between 0.2 and 0.5 g of soil (either rosin acid or light oil).

B. The soiled test piece was then immersed in 600 ml of solvent at 35° C., and the mixture mechanically agitated for 12 minutes.

C. The test piece was withdrawn and most of the solvent was allowed to drain back into the cleaning solvent bath.

D. Remaining solvent residue was removed by holding the horizontal test piece above a steam bath for 3 minutes.

E. Test pieces were then dried in an oven for 5 minutes at 120° C., cooled, and weighed.

F. Steps A to E were repeated, with the same solvent volume being employed for the cleaning step, until greater than 1 mg of soil was retained on the test piece.

The solvent performance is then expressed in terms of the solvent soil loading capacity (S) as follows:

$$S = \frac{W \times C}{V \times P} \times 100, \text{ where}$$

W=average weight of soil removed from the test piece per cleaning cycle;

C=last successful cleaning cycle;

V=solvent volume;

P=solvent density.

Results for cleaning abietic acid and light oil are described in Table 3, and expressed graphically in FIGS. 1 and 2. The small case reference letters found in FIGS. 1 and 2 correspond to the respective solvent compositions contained in Table 3. The 1 mg residual soil criteria corresponds to 99.7% abietic acid removal and 99.5% light oil removal.

TABLE 3

Comparison of Solvent Performance in the Removal of Low and Intermediate Polarity Soils

| | | Soil Loading Capacity (wt % Soil/wt % Solvent) | |
|---|---|---|---|
| Solvent | | Abietic Acid | Light Oil |
| a. | Neat para-cymene | 0.1 | 2.7 |
| b. | Neat 2-ethylhexanol | 1.6 | 2.1 |
| c. | 95% para-cymene 5% 2-ethylhexanol | 1.9 | — |
| d. | 90% para-cymene 10% 2-ethylhexanol | 2.6 | 3.3 |
| e. | 75% para-cymene 25% 2-ethylhexanol | 3.3 | — |
| f. | 50% para-cymene 50% 2-ethylhexanol | 2.7 | — |
| g. | 25% para-cymene 75% 2-ethylhexanol | 2.4 | — |
| h. | 10% para-cymene 90% 2-ethylhexanol | 1.8 | — |
| i. | para-menthadienes | 0.5 | 1.4 |
| j | 90% para-menthadienes 10% terpene alcohols | 0.9 | 2.6 |

Example 4

Steam Co-distillability

Solvent (500 g; 90% para-cymene/10% 2-ethylhexanol) and water (2000 g) was charged to a 5 L, 3-necked flask fitted with stirrer, thermometer and distillation head. The mixture was heated to reflux, and oil/water fractions were separated into oil and aqueous layers and the layers weighed to determine the oil:water ratio throughout the distillation. The oil composition was determined by gas/liquid chromatography analysis. Results in Table 4 show that the percent composition relative to the para-cymene and 2-ethylhexanol is substantially unchanged with nearly 95% of solvent recovered.

TABLE 4

Steam Distillation of Para-cymene/2-ethylhexanol Oil Composition

| Fraction Number | Cumulative Weight % of Total Charge | % Composition | |
|---|---|---|---|
| | | Para-cymene | 2-ethylhexanol |
| 1 | 7.1 | 88.4 | 7.7 |
| 2 | 14.3 | 88.5 | 7.8 |
| 3 | 21.4 | 88.5 | 7.9 |
| 4 | 28.5 | 88.7 | 8.0 |
| 5 | 35.5 | 88.5 | 8.1 |
| 6 | 42.7 | 88.5 | 8.3 |
| 7 | 49.9 | 88.5 | 8.4 |
| 8 | 56.9 | 88.4 | 8.6 |
| 9 | 64.3 | 88.4 | 8.8 |
| 10 | 71.4 | 88.3 | 9.0 |
| 11 | 78.6 | 88.1 | 9.5 |
| 12 | 86.0 | 87.7 | 10.0 |
| 13 | 93.2 | 86.7 | 11.3 |
| 14 | 98.8 | 78.8 | 19.4 |
| 15 | 99.0 | 46.4 | 51.9 |

Example 5

Chemical Stability and Co-distillability of Solvent Components for Solvent Recycle The following processing conditions were employed in an immersion-clean/steam-rinse cleaning process:

A. The dirty article was immersed in an agitated solvent tank for 10 minutes at 35° C.

B. The article was then transferred to a hot water rinse tank, held at 98°–100° C. to remove residual solvent as a steam azeotrope.

C. The article was then dried in hot air.

D. Solvent collected from both the immersion tank and hot water tank was recovered for recycle by steam distillation.

The process was operated over three consecutive days in which time many articles were cleaned. Both the immersion tank and rinse tank were covered with loose fitting lids, such that the exchange of air in the tank headspace mostly occurred during transfer of articles between tanks when the lids were temporarily removed.

The following differences were observed during cleaning with two solvent mixtures:

(1) Para-menthadiene and Terpene Alcohol Mixture:

The solvent mixture in the immersion tank underwent chemical changes in that 2% terpene epoxides and 5% polymeric residues were formed.

Residual solvent on the surface of the water in the rinse tank became resinous and inhibited the evaporation of both water and solvent.

An additional 5% residue was formed when the solvent was recovered by steam distillation, and the para-menthadiene components were recovered preferentially over the terpene alcohol components because of lower boiling points.

All these chemical changes indicate a high susceptibility of the terpenes present in the formulation to air oxidation and/or hot water instability, which reduces their effectiveness in cleaning processes. In particular, deposition of polymeric residues onto the "cleaned" article will nullify the cleaning process.

(2) Para-cymene and 2-Ethylhexanol Solvent Mixture:

No polymeric residue or epoxides were formed in any of the immersion tank, rinse tank, or steam distillation recycle process stages. In addition, the para-cymene and 2-ethylhexanol components were recovered at the same rates during the steam distillation solvent recovery step.

Example 6

This process is conducted in a conventional ultrasonic cleaning apparatus designed for use with fluorocarbons. The apparatus consists of three adjacent tanks. The first tank is constructed to be substantially filled with liquid solvent. The second and third tanks are connected and each have a bottom reservoir provided with a heater for evaporating liquid in the reservoir, so that the articles being cleaned can be subjected to vapor contact with the solvent and the solvent can condense on the articles and train back into the reservoir. All the tanks are open at the top, so as to facilitate the articles being lowered into and drawn up from the liquid or vapor phase. Chilled condenser tubes surround the open outlets of the second and third tanks.

In the invention, the solvent is mainly para-menthenes with para-cymene having a distillation range typically somewhere in the range of from 150°–200° C., and that optionally includes a small amount of isopropanol as a surface tension modifier.

A tray of metal parts or circuit boards is immersed in the solvent at 35° C. for 60 seconds with ultrasonic agitation or sub-surface circulation. The tray is removed from the immersion tank and allowed to drain into the second tank, the reservoir of which contains water (and some solvent) at 90° C. At this temperature the water and solvent azeotropes and the vapor condenses on to the articles and drains back into the reservoir. Carbon dioxide is blown into this tank so as to raise the flash point additionally.

The articles are then transferred to the third tank, the reservoir of which again contains water heated to a temperature sufficient to cause distillation. The heating is preferably conducted for sufficient time for the temperature to reach 100° C., and again carbon dioxide is preferably blown into the tank. Upon removal from this third tank, the articles are free of solvent and water.

Water and solvent are collected from the condensers to the second and third tanks and subjected to phase separation, the solvent being returned to the immersion tank and the water to the final steaming tank.

Example 7

In another example, the second tank of Example 6 can be omitted, in which event the solvent is preferably drained from the articles into the immersion tank before being transferred to the steaming tank.

What is claimed is:

1. A solvent composition for cleaning dirty articles, consisting essentially of a two part organic solvent mixture consisting of:
   (a) from about 5 to about 95 weight percent para-cymene formula; and
   (b) from about 5 to about 95 weight percent 2-ethylhexanol.

2. The composition of claim 1 wherein the para-cymene is present in an amount from about 25 to about 75 percent by weight of the organic solvent mixture and the 2-ethylhexanol is present in an amount of from about 25 to about 75 percent by weight of the organic solvent mixture.

3. The composition of claim 1 wherein the para-cymene is present in an amount from about 10 to about 90 percent by weight of the organic solvent mixture and the 2-ethylhexanol is present in an amount of from about 10 to about 90 percent by weight of the organic solvent mixture.

* * * * *

UNITED STATES PATENT AND TRADEMARK OFFICE
CERTIFICATE OF CORRECTION

PATENT NO. : 5,464,557
DATED : November 7, 1995
INVENTOR(S) : Gerald J. Ferber and Graham J. Smith It is certified that error appears in the above-indentified patent and that said Letters Patent is hereby corrected as shown below:

Column 16, line 22,
Claim 1, line 5, delete the word "formula".

Signed and Sealed this

Fifth Day of March, 1996

Attest:

BRUCE LEHMAN

Attesting Officer

Commissioner of Patents and Trademarks